Feb. 5, 1957 H. E. HANSON 2,780,683

TONE CONTROL

Filed July 2, 1952

INVENTOR.

Henning Everett Hanson

By: Moore, Olson & Trexler attys.

United States Patent Office 2,780,683

Patented Feb. 5, 1957

2,780,683

TONE CONTROL

Henning Everett Hanson, Highland Park, Ill.

Application July 2, 1952, Serial No. 296,811

3 Claims. (Cl. 179—171)

Figure 1:
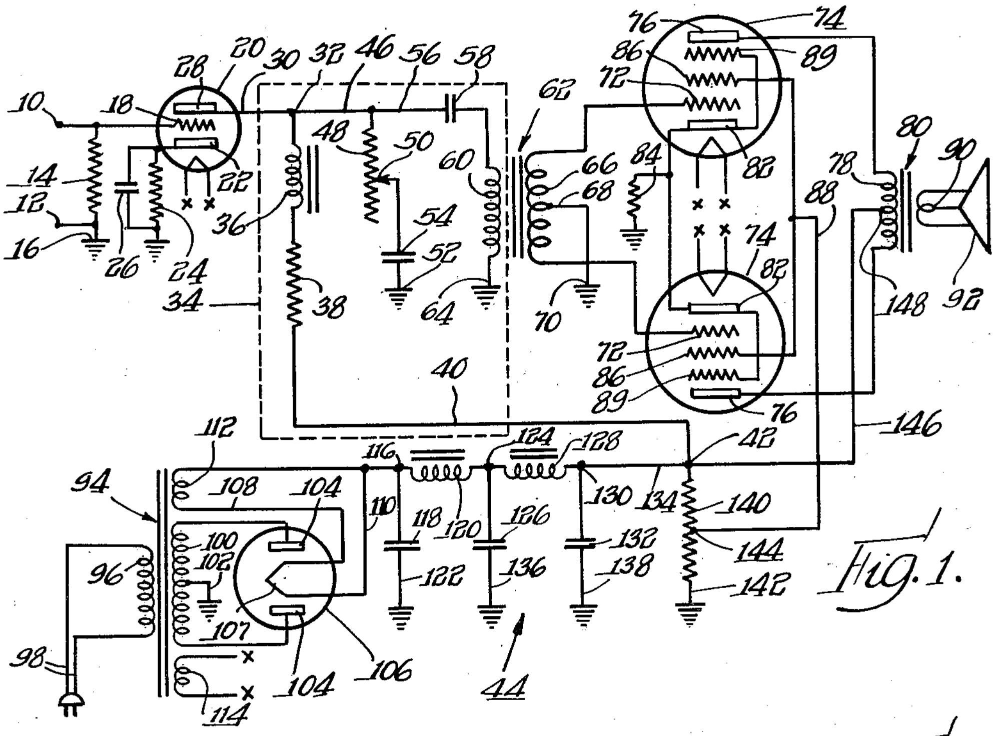

This invention is concerned with an improved tone control for an audio amplifier.

The human ear is selective. It tends not to hear low notes very well at low volume levels. Hence, for listening to music on modern phonograph records or on frequency modulation radio where the full audio band is reproduced, it is desirable to be able to provide an accentuation for the bass notes.

I am aware that it has been proposed heretofore to utilize a shunt capacitor to attenuate high frequencies and thereby relatively to emphasize the lower frequencies. The values for such capacitors have been calculated carefully and are generally accepted as being rather small, .01 microfarad being a typical value. The calculated values of capacitance have not provided a balance between the high frequencies and low frequencies which has given good reproduction at high volume levels and satisfactory reproduction at low volume levels.

It is an object of this invention to provide a tone control in an audio amplifier which insures excellent listening quality at low volume levels.

Another object of this invention is to provide a tone control in an audio amplifier insuring a good balance of high and low frequencies at substantially any output level.

A further object of this invention is to provide tone control in an audio amplifier by means of a shunting capacitor of higher value than heretofore thought possible.

More specifically, it is an object of this invention to provide tone control in an audio amplifier by means of a shunting capacitor of very high value connected in circuit to a plate load inductor.

Figure 2:
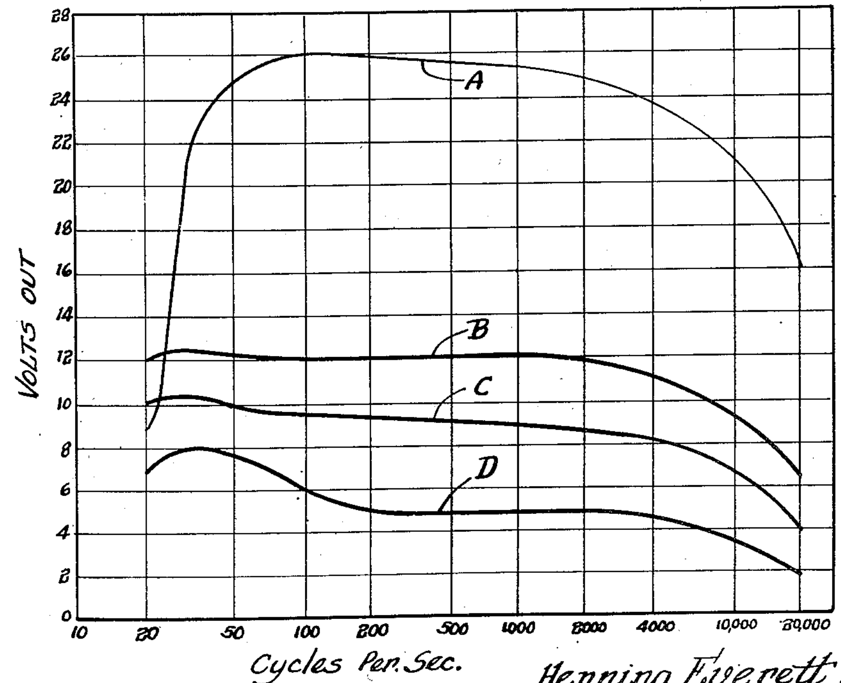

Other and further objects and advantages of the invention will be understood with reference to the accompanying figures of the drawing when taken in connection with the accompanying specification. In the drawing:

Fig. 1 is a schematic wiring diagram of an audio amplifier constructed in accordance with the principles of my invention; and Fig. 2 illustrates performance curves of the amplifier with different settings of the tone control.

Referring first to Fig. 1, there is shown an audio amplifier having input connections 10 and 12 connected across a resistor 14, the connection 12 being grounded at 16. The ungrounded input connection 10 is directly connected to the control grid 18 of a vacuum tube 20, which preferably is a triode. The cathode 22 of the tube 20 is grounded through a parallel combination of resistor 24 and capacitor 26. The heater connections are shown conventionally at *x—x*. In an amplifier constructed according to the circuit of Fig. 1, the tube 20 is a 6C5, the resistor 14 is .5 megohm, the resistor 24 is 2,500 ohms, and the capacitor 26 can be anywhere in the region of 8 to 25 microfarads.

The plate 28 of the tube 20 is connected by a wire 30 to a junction 32 indicated within a dashed line rectangle 34. The dashed line rectangle does not represent a circuit component, but is used to demarcate the inventive portion of the circuit, this portion appearing within the rectangle. The junction 32 is connected to a choke 36 which can be of any value between 300 and 700 henries, and which should be rated at 8 milliamperes. The choke 36 is in turn connected to a plate load resistor 38. Satisfactory performance has been obtained with values of the load resistor 38 varying between 60,000 and 300,000 ohms. The load resistor 38 is connected by a wire 40 to an output junction 42 on the power supply 44 as will be apparent shortly.

The junction 32 is connected by a wire 46 to one end of a variable resistor 48 having a slider or adjustable tap 50 which is grounded at 52 through a capacitor 54. The variable resistor 48 is of quite low value, having a maximum resistance of 25,000 ohms. The capacitor 54 may be of substantially any value between .25 and 1.0 microfarads. This value should be noted as it is much higher than any heretofore used in a shunt tone control. The value of the variable resistor 48 also is noteworthy due to its extremely small value.

A wire 56 leads from the junction between the wire 46 and the variable resistor 48 to a capacitor 58 which may have a value between .05 and .5 microfarads. The capacitor 58 is connected to the primary coil 60 of a 3:1 transformer 62 for driving a pair of push-pull grids from a single plate. The other end of the primary coil 60 is grounded at 64.

The secondary coil 66 of the transformer 62 is provided with a center tap 68 which is grounded at 70. The ends of the secondary 66 are connected to the control grids 72 to a pair of matched output tubes 74. The tubes preferably are of the pentode type because of their large power output and excellent results have been obtained with 6F6 tubes. The plates 76 of the tubes 74 are connected to the ends of the primary coil 78 of an output transformer 80. The cathodes 82 are grounded through a resistor 84 on the order of 250 ohms. The screen grids 86 are connected by a wire 88 to a tap on the power supply 44 as will be brought out shortly. The suppresser grids 89 are internally connected to the cathodes. The heater connections again are conventionally indicated at *x—x*.

The secondary or output coil 90 of the output transformer 80 is connected directly to the voice coil of a loudspeaker 92. The loudspeaker, in a practical amplifier, is an electrodynamic speaker having a voice coil impedance of 8–9 ohms and is rated at 18 watts output. The exciter coil is used in the power supply filter in a conventional manner as will be brought out shortly. The output transformer 80 is rated at 20 watts and is of the usual type for matching push-pull pentode tubes to an 8 ohm speaker.

The power supply 44 includes a power transformer 94 having a primary 96 connected directly to a flexible lead or drop cord 98 adapted to be plugged into the usual 110–120 volt A. C. socket.

The transformer 94 is provided with a high voltage secondary 100 rated at 700 volts and center tapped and grounded at 102. The ends of the high voltage coil 100 are connected to the plates 104 of a full wave rectifier tube 106, conveniently a 5U4. The ends of the heater-cathode 107 are connected to wires 108 and 110 leading to the ends of a rectifier filament secondary coil 112 on the transformer 94 and normally rated at 5 volts.

The transformer 94 is completed by a 6.3 volt filament coil 114 wherein the filament connections are again indicated at *x—x*.

The wire 110 from the heater-cathode of the rectifier tube 106 is connected to a junction 116 between a capacitor 118 and an inductor or choke coil 120. The capacitor 118 is grounded at 122 while the choke coil 120 is connected to a junction 124 between a capacitor 126 and an inductor or choke coil 128. The choke coil 128 is connected, in turn, to a junction 130 between a capacitor 132 and a wire 134 leading to the power supply terminal 42 previously mentioned. The capacitors 126 and 132 are grounded at 136 and 138 respectively, and the three capacitors 118, 126, 132 all are 8 microfarad electrolytic capacitors rated at 450 working volts. The choke coil 120 is an 8 henry coil rated at 200 milliamperes while the choke coil 128 may be an 8 henry coil, but preferably is the speaker field coil or exciter coil.

The power supply terminal 42 is connected to a resistor 140 which is grounded at 142. The resistor 140 is tapped to provide an output terminal 144 having a voltage lower than the terminal 42 for biasing the screen grids 86 of the output tubes 74 through the wire 88. The terminal 42 is connected to the wire 40 as previously indicated for supplying plate power to the input tube 20, and is also connected to a wire 146 leading to a center tap 148 on the amplifier output transformer 80.

I have tested an amplifier constructed in accordance with the circuit heretofore explained to ascertain the frequency response. First the choke 36 alone was tested with the circuit open where the wire 46 is illustrated, and its output curve is indicated at A in Fig. 2. The low frequency response is comparatively very low due to the relatively low impedance of the inductance at low frequencies. The impedance, and hence the output rises rapidly with frequency and then remains substantially constant over a fairly broad band and drops at higher frequencies. The drop at higher frequencies is attributed to the stray capacitance in the coil winding, and the capacitive reactance drops with increasing frequency.

The important curves are those labeled B, C, and D. The output of the novel part of the circuit, namely that within the dashed rectangle 34, is indicated in the three curves B, C, and D, the output being taken across the primary coil 60 of the transformer 62, and the input being across the input terminals 10 and 12. The output stage of the amplifier is conventional, and it is only the frequency response of the novel part with which I am concerned.

The curve B is illustrative of the output with the resistor 48 set at approximately 15,000 ohms. The curve C was obtained with the variable resistor 48 set at 10,000 ohms, and the curve D was obtained with the variable resistor 48 set at 5,000 ohms. In each case it will be observed that the response is essentially flat over a wide frequency range and remains at a reasonably high value up to 20,000 cycles per second. The bass response in each instance is excellent as low as 20 cycles per second and is boosted slightly in the curve B, and progressively greater in the curves C and D which are at lower output levels. The greatest bass boost is at the lowest output level where the human ear is most insensitive to low frequencies.

The electrical tests show the output to be excellent over substantially the entire audio range, the audio range generally having a lower limit of 16 cycles per second and extending to as high as 15 to 20,000 cycles per second depending on the individual. Listening tests reveal excellent frequency characteristics with a standard test record recorded at constant intensity from 10,000 cycles per second down to 200 cycles per second, and at constant amplitude from 200 cycles down to 50 cycles per second. Similar results are found in listening to music on modern records or on frequency modulation radio wherein the music sounds remarkably life-like.

Novelty in my invention resides not so much in the circuit chosen, but rather in the choice of values. Mathematically calculated limits on the values of the capacitor and variable resistor in the tone control have been transgressed, and better results have been obtained by the experimental values, which theoretically could not work, than can be obtained by the mathematically calculated values. Specifically, the variable resistor is of rather low value, and a value of 25,000 ohms has been found satisfactory, although usually only 10 or 15,000 ohms of this is used. The greatest departure lies in the size of the capacitor connected to the variable resistor. I use a paper capacitor of not less than .25 microfarad capacity. I have used capacitors having capacity as high at 2.0 microfarads with excellent results, but find that no benefit is obtained in increasing values substantially above .25 microfarad. The capacitor is grounded at one end, as heretofore described, while the other end is connected to the sliding tap on the variable resistor, one end of the resistor being open and the other one being connected directly to the plate of the driver tube.

The choke 36 also is necessary to satisfactory operation. When a plate load resistor is used alone without this choke, the tone control fails to operate properly. In fact, the signal is attenuated to 0 voltage when the variable resistor 48 is set to 0 value. The resistor 38 in series with the choke has been indicated as having any value between 60,000 and 300,000 ohms. In the amplifier which has been built according to the specifications, and to which I have referred heretofore, the value of this resistor amounts to 200,000 ohms.

The amplifier built according to the specifications given herein affords a frequency response which to the human ear is ideal over the entire audio spectrum. This response is obtained with the output volume at a comfortable hearing level. More specifically, full frequency response is obtained at a volume level which is comfortable to listen to at a distance of only three feet from the speaker. The foregoing description and the drawings forming a part thereof are set forth for illustrative purposes. My invention is limited only insofar as the following claims are limited and includes all that which falls fairly within the spirit and scope of the appended claims.

I claim:

1. A tone control circuit comprising an electron tube having a plate, a grid, and a cathode, means connecting said cathode to ground, an input circuit connected to said grid and to ground, a source of B+ potential having a negative ground, a series connected resistor element and choke element, said choke element having a value substantially between 300 henries and 700 henries, one of said elements being connected to said plate and the other of said elements being connected substantially directly to said source of B+ potential, a series connected resistor and capacitor, said resistor having a value of less than substantially 25,000 ohms and said capacitor having a value of at least substantially .25 microfarad, one of said series connected resistor and capacitor being connected to said plate and the other of said series connected resistor and capacitor being connected to ground, a coupling condenser, means connecting one side of said coupling condenser to said plate, a second electron tube having a control grid, and means connecting the other side of said coupling condenser to said grid of said second electron tube.

2. A tone control circuit as set forth in claim 1 wherein the resistor of the series connected resistor and capacitor is a variable resistor.

3. A tone control circuit as set forth in claim 1 wherein the choke element is connected to said plate, and the resistor element is connected to said source of B+ potential.

References Cited in the file of this patent

UNITED STATES PATENTS

| | | |
|---|---|---|
| 1,715,501 | Hiler | June 4, 1929 |
| 1,931,596 | Wheeler | Oct. 24, 1933 |
| 1,984,450 | Aceves | Dec. 18, 1934 |
| 2,118,075 | Farnham | May 24, 1938 |
| 2,505,254 | Mesner | Apr. 25, 1950 |

FOREIGN PATENTS

| | | |
|---|---|---|
| 340,615 | Great Britain | Jan. 5, 1931 |